(12) United States Patent
Wu

(10) Patent No.: US 7,307,844 B2
(45) Date of Patent: Dec. 11, 2007

(54) HEAT DISSIPATION MECHANISM FOR ELECTRONIC APPARATUS

(75) Inventor: Chung-Ju Wu, Kaohsiung (TW)

(73) Assignee: Silicon Integrated Systems Corp. (TW)

( * ) Notice: Subject to any disclaimer, the term of this patent is extended or adjusted under 35 U.S.C. 154(b) by 269 days.

(21) Appl. No.: 11/056,533

(22) Filed: Feb. 11, 2005

(65) Prior Publication Data

US 2005/0111195 A1    May 26, 2005

(30) Foreign Application Priority Data

Nov. 30, 2004    (TW) ............................. 93136836 A

(51) Int. Cl.
*H05K 7/20*    (2006.01)
(52) U.S. Cl. ............... 361/719; 361/704; 174/16.1; 174/16.3; 165/80.2; 165/80.3; 165/185
(58) Field of Classification Search ............... None
See application file for complete search history.

(56) References Cited

U.S. PATENT DOCUMENTS 5,065,279 A * 11/1991 Lazenby et al. ........... 361/720
5,926,944 A * 7/1999 Smith et al. ............... 29/602.1
5,991,155 A * 11/1999 Kobayashi et al. ......... 361/705
6,025,991 A * 2/2000 Saito .......................... 361/704
6,034,874 A * 3/2000 Watanabe ................... 361/704
6,225,559 B1 * 5/2001 Hubner et al. ............. 174/542
6,226,184 B1 * 5/2001 Stolz et al. ................ 361/704
6,257,328 B1 * 7/2001 Fujiwara et al. ........... 165/185
6,313,995 B1    11/2001 Koide et al.
6,434,006 B1 * 8/2002 Fukatsu et al. ............ 361/704
6,545,871 B1 * 4/2003 Ramspacher et al. ...... 361/709
6,618,252 B2 * 9/2003 Choi .......................... 361/719
6,673,998 B1 * 1/2004 Wu ............................ 174/383
6,809,932 B2 * 10/2004 Wu ............................ 361/719
6,977,815 B2 * 12/2005 Hsu ........................... 361/704
6,999,317 B2 * 2/2006 Chengalva et al. ......... 361/715
7,082,034 B2 * 7/2006 Tiwari et al. .............. 361/719

* cited by examiner

*Primary Examiner*—Boris Chervinsky
(74) *Attorney, Agent, or Firm*—Squire Sanders & Dempsey, LLP

(57) ABSTRACT

This disclosure presents a heat dissipation mechanism, which conducts generated heat of a thermal device to the housing of an electronic apparatus by a metal piece fastened between the thermal device and electronic apparatus, and then dissipates heat into the air through multiple holes opened over an apparatus shell. Besides, the presented mechanism is also suitable to mini-size, portable electronic apparatus to solve the thermal dissipation technique thereof.

22 Claims, 6 Drawing Sheets

HEAT DISSIPATION MECHANISM FOR ELECTRONIC APPARATUS

BACKGROUND OF THE INVENTION

1. Field of the Invention

The presented invention relates to a heat dissipation mechanism, which conducts generated heat of a thermal device for housing of electronic apparatus by a metal piece.

2. Description of the Prior Art

Some electronic devices, such as a CPU, north bridge, or VGA . . . etc., generate huge amounts of heat because of the power consumption caused by impedance when they are transmitting or processing data. If the generated heat is not properly dissipated from the devices, it may influence the process efficiency of the electronic apparatus, reduce their usage life span, furthermore the electronic devices will be broken. Therefore, if an electronic apparatus consists of foregoing heat generated devices, heat dissipation problems must be considered to ensure the process efficiency and the usage life span thereof. Nowadays lots of heat dissipation mechanisms are proposed, the apparatus designers may achieve the goals for dissipating heat by adopting different methods in according to different demands or applications.

Generally, for protecting electronic devices, users, or for having an attractive look, most electronic apparatus, such as computers, television sets, radio receivers . . . etc., enclose most of their composing devices within a housing. However, the generated heat of the electronic device is going to stock in the housing and does harm to the other electronic devices if without any heat dissipation mechanism. One of the popular heat dissipation mechanism is to set up a heat dissipation device, such as a fan or a heat dissipating fin, upon the thermal device, which transfers heat into the air contained in the housing. The housing sets up several holes (openings) and the generated heat will then dissipate into the external cold air through those holes by convection. Sometimes in order to increase the convection efficiency, an additional electric fan is used for forceful convection, which increases the heat dissipation speed among the housing.

Heat dissipating fins, heat dissipating openings, and electric fans are famous heat dissipation methods, which could be adopted according to different demands of heat dissipation efficiency or electronic apparatus. Among them, heat dissipating openings usually co-operate with an electric fans to increase the dissipation efficiency. However, an electric fan consumes power and occupies space, therefore it may not suitable to some devices (i.e., a flash drive, a mini-mp3 player, or a wireless network card). But if only the heat dissipating openings are applied, the dissipating efficiency is too bad and unacceptable. Therefore, herein the invention provides a heat dissipation mechanism for electronic apparatus, which still utilizes the heat dissipating openings but with improved dissipating efficiency.

SUMMARY OF THE INVENTION

As mentioned above, an aspect of the invention is to provide a heat dissipation mechanism for electronic apparatus, which dissipates the generated heat of the thermal devices into external cold air through the openings set upon the housing.

Besides, an another aspect of the invention is to provide a heat dissipation mechanism for small, portable electronic apparatus for dissipating heat more effectively. In order to prevent the burning of human skin, the design for heat dissipating regions (specially the heat dissipating openings) are specified to prevent the human skin to sink into the openings, touch the inner metal pieces and get burnt.

The present heat dissipation mechanism of the invention includes: a substrate, a housing and a heat conductive metal piece. Among them, one or multiple thermal devices fasten on to the substrate. At least one heat dissipation region is set upon the housing, which has a plurality of openings penetrating through the housing. The heat conductive metal piece connects with the thermal devices and further connects to at least a heat dissipation region, which conducts heat from the thermal devices to the heat dissipation region and performs a thermal exchange with external cold air to dissipate heat.

DESCRIPTION OF THE PREFERRED EMBODIMENT

The present invention will now be described in detail with reference to the drawings, which are provided as illustrative examples of the invention so as to enable those skilled in the art to practice the invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention.

Figure 1A:
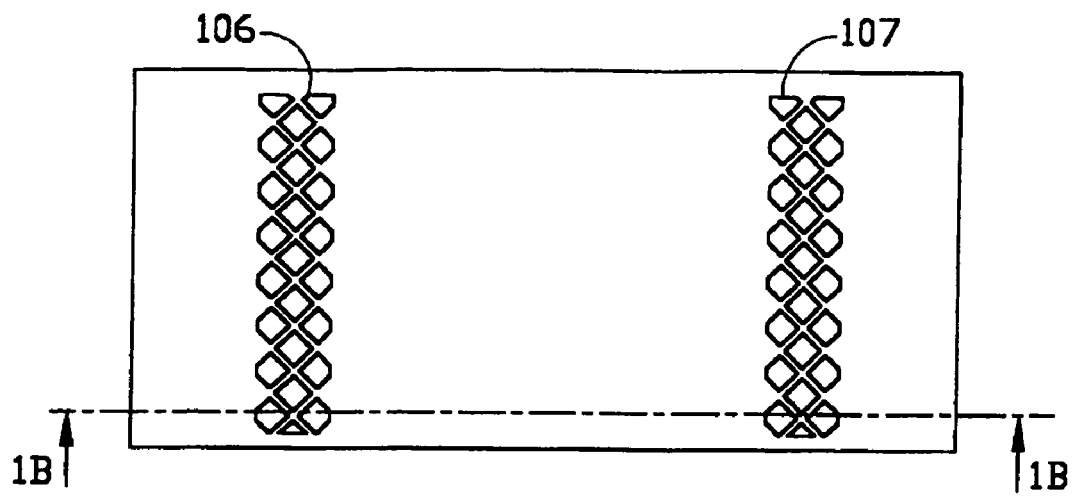
FIG. 1A illustrates the housing for electronic apparatus with the preferred embodiment of the invention.
Figure 1B:
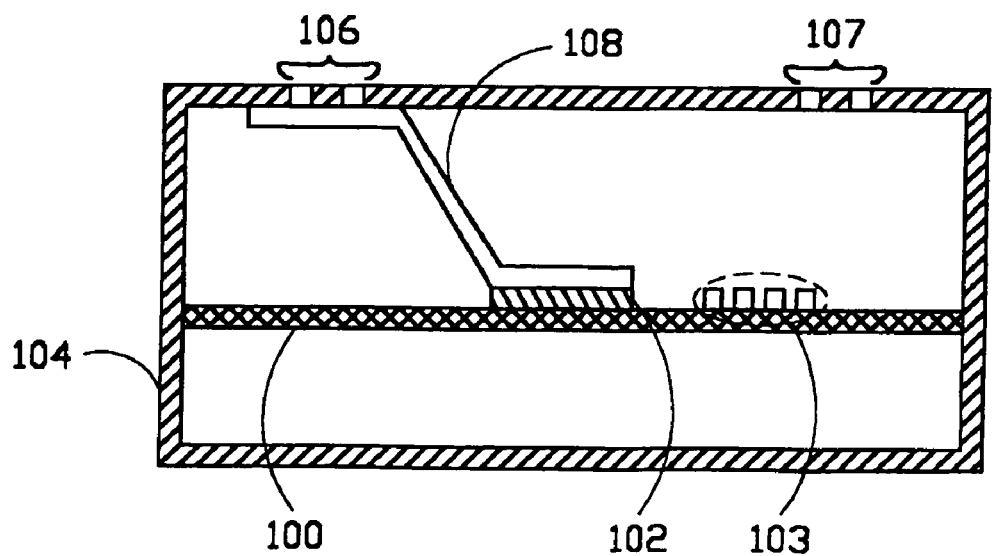
FIG. 1B illustrates the cutaway view of the surface of the housing in FIG. 1A.

FIG. 1A and FIG. 1B illustrate the housing for a heat dissipation mechanism with the preferred embodiment of the invention and its cutaway view from 1B direction respectively. Substrate 100, on which fastened at least a thermal device 102 and the other devices 103. Thermal device 102 is the major heat source of an electronic apparatus, and the material for the substrate 100 is a printed circuit board (PCB) in the embodiment. Substrate 100, thermal device 102 and the other devices 103 are totally enclosed in the housing 104. The housing 104 has a plurality of openings opened and distributed on it to make the heat enclosed in the housing 104 convecting with external cold air. For clear descriptions, the area with concentrated openings are called a heat dissipation region, the housing 104 may include one or several heat dissipation regions (i.e., 106, 107). Of course, each heat dissipation region may have only one opening, the amount of openings for forming a heat dissipation region is not limited in the invention.

According to the drawings, the heat conductive metal piece 108 shapes of a strip and two sides are bent in this embodiment, therein one side connects to thermal device 103 and the other side connects to the heat dissipation region 106. It's noticed that, the shape for heat conductive metal piece 108 is not limited, besides, how many thermal devices and heat dissipation regions the heat conductive metal piece may connect with are neither limited in the invention. For example, the heat conductive metal piece 108 may be in the shape of an English letter "Y", which connects to a thermal device with the bottom side of "Y" and two different heat dissipation regions with the top sides of "Y". In other words, heat conductive metal piece 108 may connect to multiple heat dissipation regions.

Figure 1C:
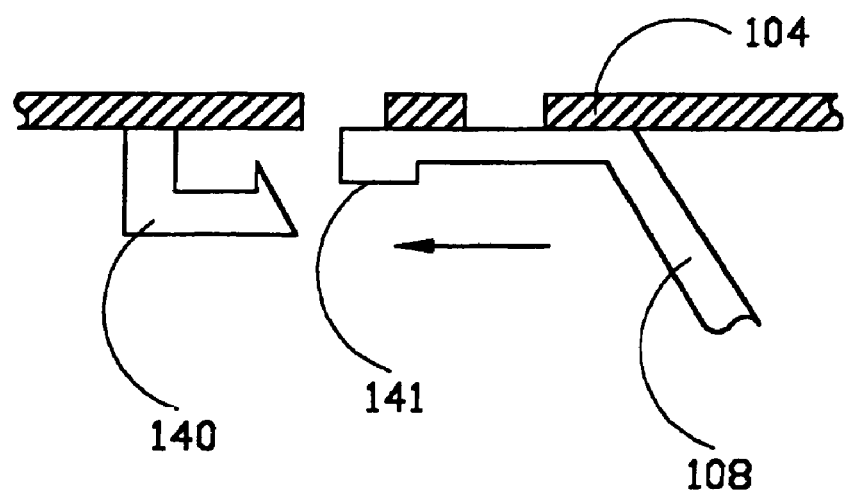
FIG. 1C shows the structure diagram of a fixing component of bolt.
Figure 1D:
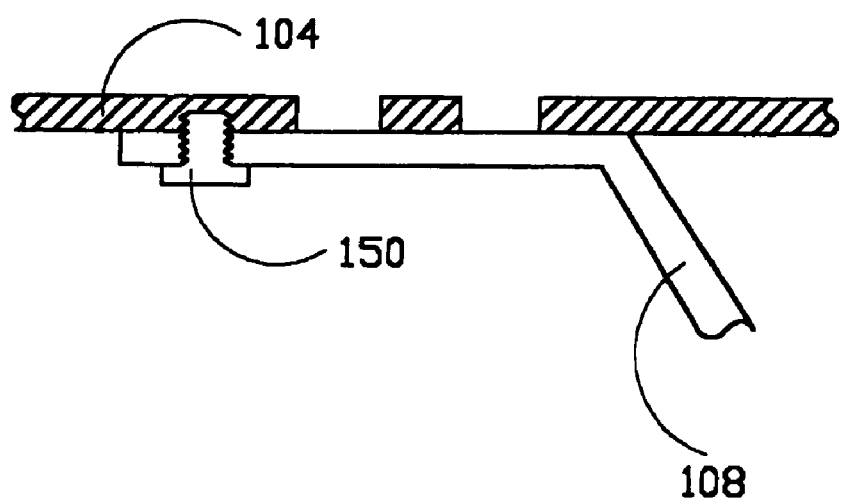
FIG. 1D shows the structure diagram of another fixing component of screw.

A heat dissipation region connected to the heat conductive metal piece may specially be named as a thermal exchange region; for example, heat dissipation region 106 is a thermal exchange region. Usually the heat conductive metal piece 108 is made of metal material with high heat conductivity, such as copper or some compound metals. Heat conductive metal piece 108 may attach on the thermal device 102 with a heat conductive adhesive rubber, and fasten beneath the heat dissipation region 106 with a fixing component. As shown in FIG. 1C, a bolt for the fixing component is applied. With the front end 141 of the heat conductive metal piece which shapes as shown in the drawing, the heat conductive metal piece 108 could insert into the bolt 140 for fastening beneath the inner surface of the housing 104. Except to the bolt 140, it may adopt a screw 150 for the purpose of fastening the heat conductive metal piece (shown in FIG. 1D). It's also allowable to design the structure of the heat conductive metal piece 108 particularly to make one side of the heat conductive metal piece connecting to the heat dissipation region 106 exactly and naturally under the inner surface of the housing 102 when fabricating housing 102 and the inner devices, therefore no fixing component (such-like a bolt or a screw) is needed. In an embodiment of the invention, referring to FIGS. 1Ea and 1Eb, heat conductive metal piece 108 is flexible and bendable. Housing 104 and substrate 100 put stress on heat conductive metal piece 108 when fabricating, so that the heat conductive metal piece 108 expands until both side of heat conductive metal piece 108 contact the flanks of housing 104 for fixing the position thereof.

Figure 1E:
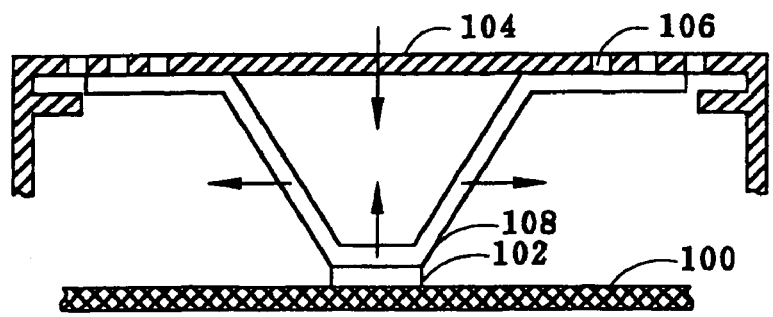
FIG. 1Ea illustrates a kind of heat dissipation structure with flexible heat conductive metal piece and FIG. 1Eb shows the structure thereof after fabricating.
Figure 1E:
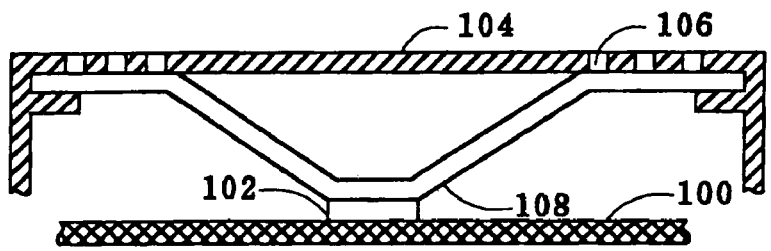
Figure 1F:
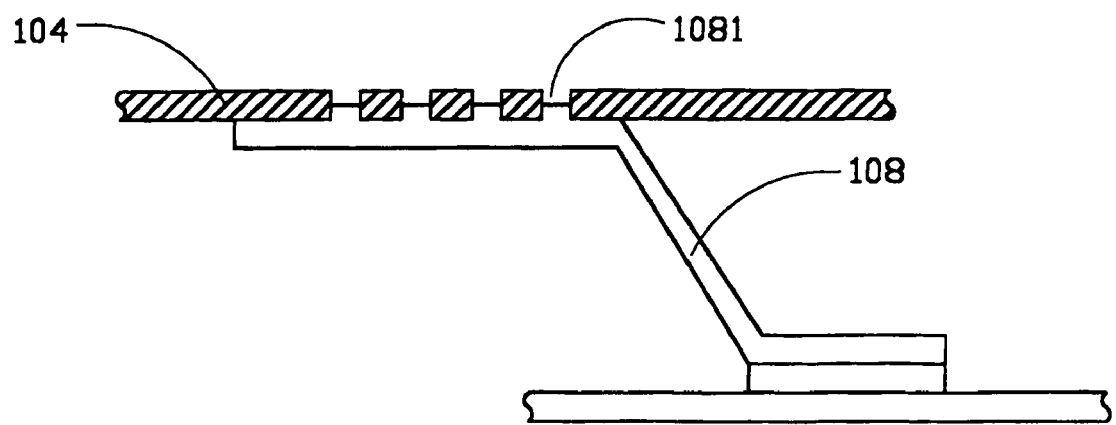
FIG. 1F illustrates a kind of heat dissipation structure with a heat conductive metal piece having a plurality of bulges, which insert in the openings for fastening on the housing.
Figure 1G:
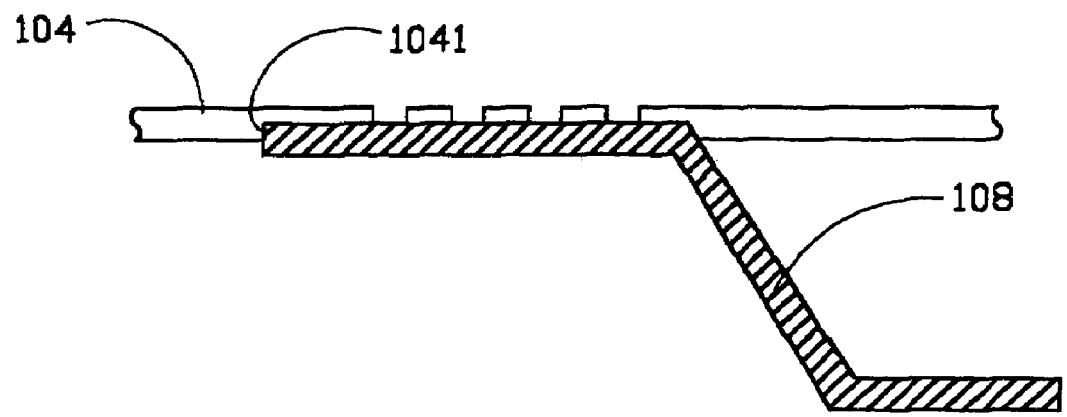
FIG. 1G illustrates a housing having a hollow structure for fastening the heat conductive metal piece.

Furthermore, as shown in FIG. 1F, a plurality of bulges 1081 may be applied upon the heat conductive metal piece 108. Similarly, no fixing component is needed by inserting each budge 1081 into the corresponding openings of the heat dissipation region 106, the heat conductive metal piece 108 attaches to the heat dissipation region 106 to form a thermal exchange region. Besides, the housing 104 may form a hollow structure 1041 (shown in FIG. 1G) for fixing heat conductive metal piece 108. Of course, the hollow structure 1041 is not limited as the shape presenting in FIG. 1G, it may do some variations for different demands.

Figure 1H:
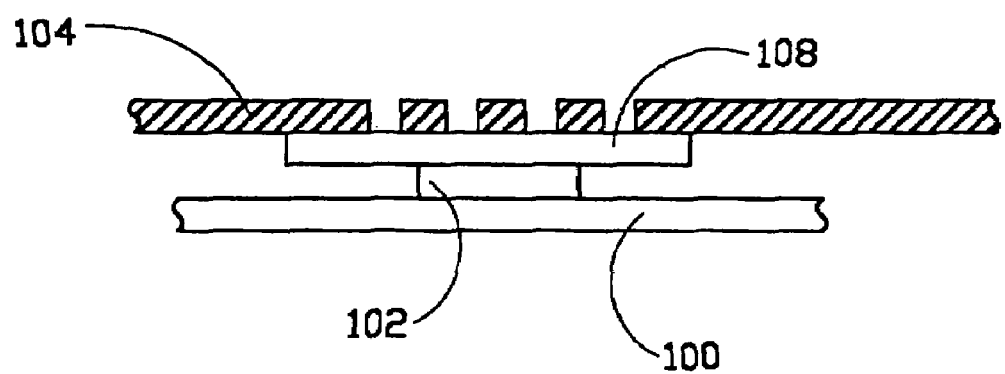
FIG. 1H illustrates a kind of heat dissipation mechanism with a strip-shaped heat conductive metal piece.
Figure 1I:
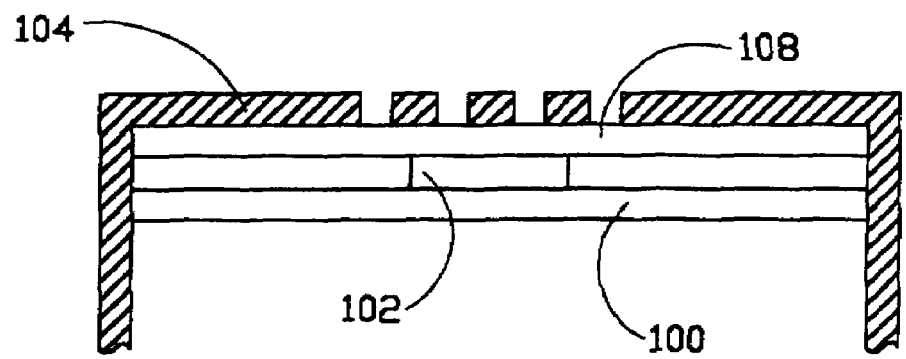
FIG. 1I illustrates another heat dissipation mechanism with a strip-shaped heat conductive metal piece.

Not only the mentioned examples for fastening a heat conductive metal piece 108 on the heat dissipation region 106, referring to FIG. 1H, it may utilize a slice-shaped metal piece to insert between the heat dissipation region 106 and the thermal device 102 with the heat conductive adhesive rubber, thereby simplifying the structure of heat conductive metal piece 108 and decreasing the thickness of the electronic apparatus. Besides, as shown in FIG. 1I, if the slice-shaped heat conductive metal piece 108 expands to an inner side of the housing 104 and the thermal device 102 clips it with housing 104 directly when fabricating the electronic apparatus, the rubber for fastening the heat conductive metal piece 108 may be further discarded.

In addition, the housing 104 may reserve several heat dissipating regions without connecting to the heat conductive metal pieces but purely for convection. In other words, the amounts for the thermal exchange regions are not limited, and a heat dissipation region is not intended to be absolutely attached with the heat conductive metal piece to form a thermal exchange region.

When the thermal device 102 of an electronic apparatus generates large amounts of heat, the place between the heat conductive metal piece 108 and the thermal device 102 has a relatively higher temperature comparing to the place between the heat conductive metal piece 108 and heat dissipation region 106. According to the principle of thermal conduction, the heat will transfer from the higher temperature side to lower temperature side. Therefore, the generated heat will transfer to the heat dissipation region 106 to achieve the objective of dissipating the heat by exchanging heat with external cold air through the openings.

It's noticed that, the main spirit of the invention is to utilize a heat conductive metal piece connecting to the heat dissipation region as the major heat dissipating method. The heat dissipation regions are not only limited on top of the electronic apparatus as shown in FIG. 1B, the heat dissipation regions are allowable to be placed on any direction, any areas of the housing as the thermal exchange region for different demands.

Figure 2:
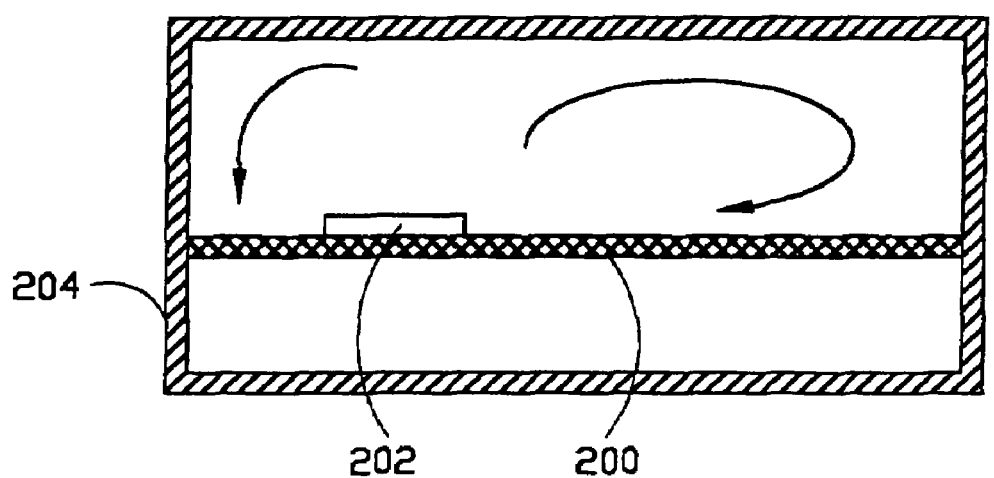
FIG. 2 illustrates the structure diagram for conventional small, portable electronic apparatus.

The heat dissipation mechanism of the invention is particularly suitable for small, portable electronic apparatus, such as flash drives, mp3 player, and a wireless network card . . . etc., which is capable of solving the problem of that a small, portable apparatus is harder to dissipate heat. FIG. 2 illustrates the structure diagram for a conventional small-size electronic apparatus, in which there is a thermal device 202 fastening on substrate 200 and enclosed in housing 204. The generated heat transfers from thermal device 202 into the air enclosed in housing 204, and then distributes to different areas of the inner space of the electronic apparatus by the inner convection. Unlike the larger electronic apparatus, which may perform the inner convection for distributing heat to other inner spaces for decreasing the temperature of the thermal device, the inner space for small-size electronic apparatus is too narrow, which makes the generated heat easier to stock in the electronic apparatus.

If only the heat dissipating openings are set to dissipate heat, there is just a few heat will be dissipated by convention. Openings for small electronic apparatus are smaller; therefore the convection is relatively unobvious. Besides, because of the limitations for inner space and power, most small electronic apparatus's could not utilize an electric fan to enhance convection. Table 1 listed beneath shows the comparison results with different heat dissipating methods as applying to the small electronic apparatus of FIG. 2, in which the last term indicates the simulation result with the mechanism of the invention. The present mechanism of the invention applies multiple heat dissipating openings and a heat conductive metal piece to the chip.

TABLE 1

| Heat dissipation mechanism | Surface temperature of chip (° C.) |
|---|---|
| Totally sealed (No heat dissipation method applied) | 98.39 |
| A copper piece attached on chip but no heat dissipating openings | 96.12 |
| A heat dissipating opening but no heat conductive metal piece | 96.29 |
| Several heat dissipating openings but no heat conductive metal piece | 96.05 |
| The present heat dissipation mechanism of the invention | 61.78 |

As shown in Table 1, because it's hard for small electronic apparatus to dissipate heat by setting heat dissipating openings only, the surface temperature of chip is unable to cool down.

Figure 3A:
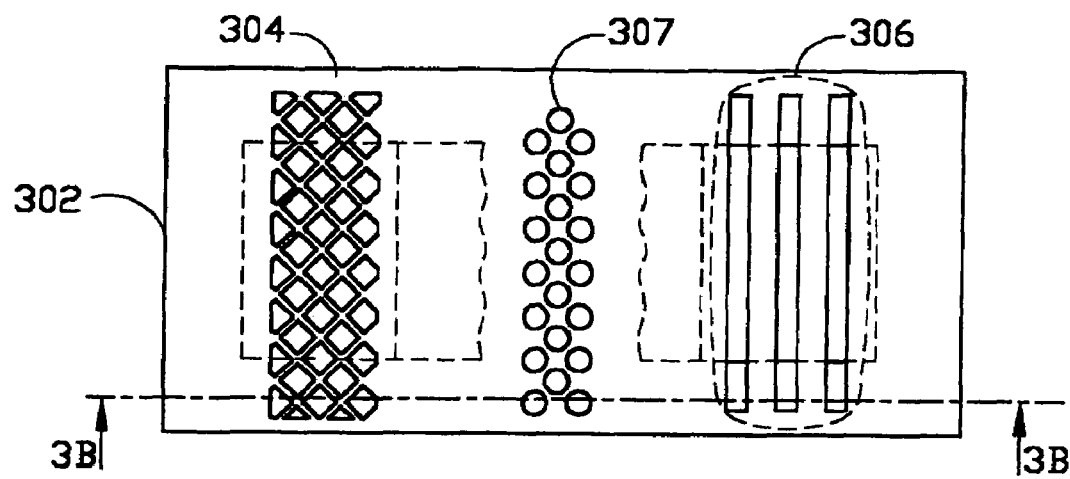
FIG. 3A illustrates the design diagram of heat dissipation region for small, portable electronic apparatus.
Figure 3B:
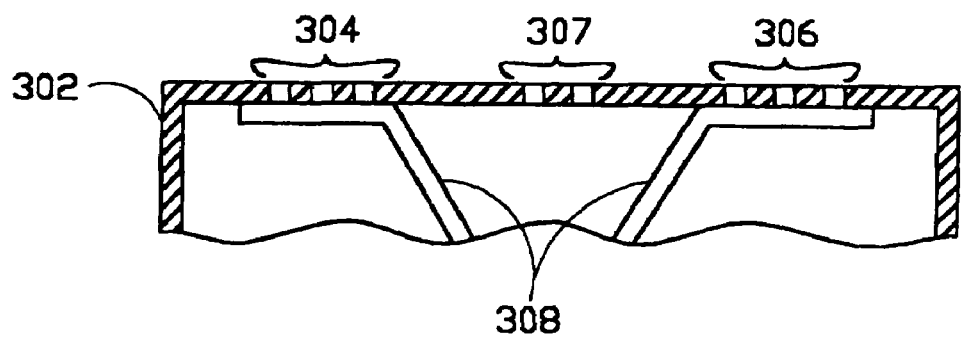
FIG. 3B illustrates the cutaway view of the present heat dissipation mechanism from 3B direction.

When applying foregoing heat dissipation mechanism to small electronic apparatus, it might be further considered that how to prevent users from incautiously touching the heat conductive metal piece 108 and getting scalded. FIG. 3A illustrates the design diagram for the heat dissipation region (specially relate to thermal exchange region) as applying to small electronic apparatus, and FIG. 3B is the cutaway view from 3B direction. The openings may be designed with mesh shape (304), dot shape (307), or strip shape (306), and further attach to the heat conductive metal piece 308 beneath.

For different demands, the size and height for the openings of the thermal exchange region may be designed to prevent human skin from touching heat conductive metal piece 308, especially as utilizing the mechanism shown in FIG. 1E to fasten the heat conductive metal piece. For example, housing 302 is usually formed by injection molding and has a thickness of 1 mm around. If the openings for thermal exchange regions are designed with meshed-shapes (304) or dotted-shapes (307), the size for each opening should be smaller than 2 mm; if within strip-shapes (306), the width for each opening should be smaller than 1.5 mm to prevent scalding the human skin. Of course, the openings for the heat dissipation regions that are not connected with the heat conductive metal piece (i.e., 307) are unnecessary for obeying the foregoing limitations. Besides, the housing 302 could be made of the materials having a low thermal conduction coefficient, such as an acrylic or plastic, to prevent from scalding human skin.

Foregoing the design patterns for the opening of the heat dissipation region (especially the thermal exchange region) are used to illustrate the feasible manner of the invention, and the basic design principle for the openings is to prevent the scalding of human skin, not only limited to be implemented with above-mentioned shapes, size, or heights. As the mentioned heat dissipation mechanisms in FIG. 1A to FIG. 1H are applied to a small, portable electronic apparatus, some components of the heat dissipation mechanism should obey the principles described in the previous paragraph, therefore it could be regarded as an another preferred embodiment of the invention.

The above-mentioned are only the preferred embodiments of the present invention, not intended to limit the scope thereof. It will be appreciated and carried out by those professions skilled in the art. Thus, many modifications of the embodiments that can be made without departing from the spirit of the present invention should be covered by the following claims.

What is claimed is:

1. A heat dissipation mechanism for electronic apparatus comprising:
    a substrate, at least one thermal device being fastened on said substrate;
    a housing, for enclosing said substrate, wherein said housing comprises a heat dissipation region having an inner surface and a plurality of openings penetrating through said housing; and
    a heat conductive metal piece, for connecting said at least one thermal device and the inner surface of said heat dissipation region, wherein said heat conductive metal piece is attached to said at least one thermal device by a heat conductive adhesive material, and said inner surface has a hollow structure for engaging and fastening said heat conductive metal piece.

2. The heat dissipation mechanism of claim 1, wherein said heat conductive metal piece has a structure having same shape as said hollow structure, such that said structure directly engages said hollow structure of said inner surface.

3. The heat dissipation mechanism of claim 1, wherein said heat conductive metal piece is flexible.

4. The heat dissipation mechanism of claim 1, wherein said heat conductive metal piece has a plurality of bulges for individually inserting into said plurality of openings of said heat dissipation region, such that each of said plurality of bulges and said housing form a recess to prevent said heat conductive metal piece from being touched by user.

5. The heat dissipation mechanism of claim 1, wherein said heat conductive metal piece is slice-shaped and is attached to said housing.

6. A heat dissipation mechanism for applying to the portable electronic apparatus comprising:
    a substrate, at least one thermal device being fastened on said substrate;
    a housing, for enclosing said substrate, wherein said housing has at least one heat dissipation region having an inner surface and a plurality of openings penetrating through said housing; and
    a heat conductive metal piece, for connecting said at least one thermal device and the inner surface of said at least one heat dissipation region, wherein said heat conductive metal piece and said at least one thermal device form a contact area approximatively equivalent to area of said at least one thermal device occupied in said substrate, and said housing is formed of a material with low thermal conduction coefficient.

7. The heat dissipation mechanism of claim 6, wherein said heat conductive metal piece is attached to said at least one thermal device by a heat conductive adhesive material.

8. The heat dissipation mechanism of claim 6, wherein said material with low thermal conduction coefficient comprises acrylic.

9. The heat dissipation mechanism of claim 6, wherein said material with low thermal conduction coefficient comprises plastic.

10. The heat dissipation mechanism of claim 6, wherein said plurality of openings are mesh-shaped, and said plurality of openings has a size and a height capable of preventing said heat conductive metal piece from being touched by user.

11. The heat dissipation mechanism of claim 10, wherein the height of each of said plurality of opening is thicker than 1 mm, and the size of each of said plurality of opening is smaller than 2 mm.

12. The heat dissipation mechanism of claim 6, wherein said plurality of openings are dot-shaped.

13. The heat dissipation mechanism of claim 10, wherein said plurality of openings are strip-shaped.

14. The heat dissipation mechanism of claim 13, wherein the height of each of said plurality of opening is thicker than 1 mm and the size of each of said plurality of opening is smaller than 1.5 mm.

15. The heat dissipation mechanism of claim 6, wherein said heat conductive metal piece is attached to said at least one heat dissipation region with a fixing component.

16. The heat dissipation mechanism of claim 15, wherein said fixing component comprises a bolt.

17. The heat dissipation mechanism of claim 15, wherein said fixing component comprises a screw.

18. The heat dissipation mechanism of claim 6, wherein said heat conductive metal piece has a structure that directly attaches to the inner surface of said at least one heat dissipation region without any fixing component.

19. The heat dissipation mechanism of claim 6, wherein said heat conductive metal piece is flexible.

20. The heat dissipation mechanism of claim 6, wherein said heat conductive metal piece has a plurality of bulges for respectively inserting into said plurality of openings of said at least one heat dissipation region, such that each of said plurality of bulges and said housing form a recess to prevent said heat conductive metal piece from being touched by user.

21. The heat dissipation mechanism of claim 18, wherein said inner surface has a hollow structure for fastening said structure of said heat conductive metal piece.

22. The heat dissipation mechanism of claim 6, wherein said heat conductive metal piece is slice-shaped and is attached to said housing.

* * * * *